United States Patent [19]

Heller et al.

[11] 4,273,594
[45] Jun. 16, 1981

[54] GALLIUM ARSENIDE DEVICES HAVING REDUCED SURFACE RECOMBINATION VELOCITY

[75] Inventors: Adam Heller, Bridgewater; Harry J. Leamy, Summit; Barry Miller, New Providence; Ronald J. Nelson, Berkeley Heights, all of N.J.; Bruce A. Parkinson, Ames, Iowa

[73] Assignee: Bell Telephone Laboratories, Incorporated, Murray Hill, N.J.

[21] Appl. No.: 82,002

[22] Filed: Oct. 5, 1979

[51] Int. Cl.$^3$ .................... H01L 31/04; H01L 21/306
[52] U.S. Cl. .................... 148/33.3; 136/258; 136/260; 148/174; 148/175; 148/33; 357/15; 357/52; 357/61; 427/82; 427/84; 427/85; 427/88; 428/620
[58] Field of Search ................ 148/174, 175, 33, 33.3; 427/82, 84, 85, 87, 88, 89; 428/620, 642; 136/89 TF, 89 CD; 429/111; 357/15, 52, 61

[56] References Cited

U.S. PATENT DOCUMENTS

| | | | |
|---|---|---|---|
| 3,340,599 | 9/1967 | Webb et al. | 29/572 |
| 4,182,796 | 1/1980 | Heller et al. | 429/111 |

OTHER PUBLICATIONS

Leamy et al., "Reduction of the GaAs Surface Recombination Velocity by Chemical Treatment", *Abstract*, Electronics Materials Conf., Jun. 27-29, 1979.
DiStefano et al., "Reduction of Grain Boundary . . . Solar Cells", Applied Physics Letters, vol. 30, No. 7, Apr. 1, 1977, pp. 351-353.
Heller et al., "12% Efficient . . . Solar Cell", Conf. Rec., 13 IEEE Photovoltaic Spec. Conf., Jun. 5-8, 1978, pp. 1253-1254.
Parkinson et al., "Enhanced . . . Solar Energy . . . Gallium Arsenide . . . ", Applied Phys. Letters, vol. 33, No. 6, Sep. 15, 1978, pp. 521-523.
Hovel, H. J., "Semiconductors and Semimetals", Text, Academic Press, N.Y., 1975, pp. 26-33.
Nakato et al., "Photo-Electrochemical . . . Thin Metal Films", Chemistry Letters (Chem. Soc. Japan), 1975, pp. 883-886.
Parkinson et al., "Effects of Cations . . . Liquid Junction Solar Cell", J. Electrochem. Soc., vol. 126, No. 6, Jun. 1979, pp. 954-960.
Yeh et al., "Progress Towards . . . Thin Film GaAs AMOS Solar Cells", Conf. Rec., 13th IEEE Photovoltaic Specialists Conf., Jun. 5-8, 1978, pp. 966-971.
Bindra et al., "Electrolytic Deposition of Thin Metal Films . . . Substrates", J. Electrochem. Soc., vol. 124, No. 7, Jul. 1977, pp. 1012-1018.
Stirn et al., "Technology of GaAs . . . Solar Cells", IEEE Trans. on Electron Devices, vol. Ed. 24, No. 4, Apr. 1977, pp. 476-483.

*Primary Examiner*—L. Dewayne Rutledge
*Assistant Examiner*—W. G. Saba
*Attorney, Agent, or Firm*—Richard D. Laumann

[57] ABSTRACT

Semiconductor devices using chemically treated n-type GaAs have greatly reduced surface recombination velocities. A preferred embodiment uses fractional monolayers of ruthenium on the GaAs surface.

6 Claims, 2 Drawing Figures

GALLIUM ARSENIDE DEVICES HAVING REDUCED SURFACE RECOMBINATION VELOCITY

TECHNICAL FIELD

This invention is concerned with gallium arsenide devices having chemically treated surfaces.

BACKGROUND OF THE INVENTION

In many types of minority carrier semiconductor devices, for example, photodetectors, solar cells, light emitting diodes and laser diodes, device performance may be limited by surface recombination of carriers. Surface recombination of carriers is generally undesirable and may limit device efficiency and performance for at least two reasons. First, the efficiency of minority carrier devices is reduced because carriers are lost in the recombination process and are, therefore, not collected and, second, surface recombination inevitably leads to some heating of the semiconductor device, and as the device temperature rises, the device is more likely to fail.

The probability of surface recombination of carriers is proportional to what is termed the surface recombination velocity. Reduction of the surface recombination velocity can yield substantial improvements in efficiency for many devices. This is true for direct bandgap solar cells where most carriers are generated close to the surface. For example, theoretical calculations of the internal spectral response for GaAs P/N solar cells having a junction depth of 0.5 $\mu$m show that a reduction in the surface recombination velocity from $10^6$ cm/sec to $10^4$ cm/sec increases the device efficiency by a factor of approximately 2. Further reductions in surface recombination velocity, however, yield only a small improvement in efficiency. The effect of surface recombination velocity on efficiency is discussed by H. J. Hovel in *Semiconductors and Semimetals*, Vol. 11, Solar Cells, Academic Press, New York, 1975, at pp. 28–29.

Several techniques have been used in attempts to reduce the surface recombination velocity which is proportional to the number of surface trapping centers per unit area at the boundary region. For example, a lattice matched heterojunction formed by growing a layer of $Ga_{1-x}Al_xAs$ on the air-exposed surface of GaAs reduces the recombination velocity. The recombination velocity after such a layer has been grown is typically 450 cm/sec. This is approximately 3 orders of magnitude smaller than the surface recombination velocity at the GaAs-air interface. The surface state density may be altered by well known surface treatments such as the growth of native oxides and deposition of $SiO_2$ or silicon nitride. However, these surface treatments have not been shown to decrease the surface recombination rate, although they do alter the surface state density. Thus, growth of a lattice matched heteroepitaxial layer appears to be the only technique presently available which reduces the surface recombination velocity. However, for many applications, growth of a heteroepitaxial layer, resulting in the formation of a lattice matched heterojunction, is either not practical or desirable, and other techniques which reduce the surface recombination velocity would be useful.

Surface treatment of one GaAs device has been shown to greatly improve device efficiency. Chemical treatment of the GaAs electrode in a semiconductor-liquid junction solar cell has been shown to increase device efficiency. In *Applied Physics Letters*, 33, p. 521 (1978), an efficiency of approximately 12 percent for a solar cell having a chemically treated electrode was reported. An efficiency of less than 10 percent was obtained for a similar cell without such electrode surface treatment. The particular device described had a fraction of a monolayer of ruthenium on the GaAs electrode surface that contacted an aqueous selenide/polyselenide solution. It was hypothesized in the article that the ruthenium on the GaAs electrode surface altered the surface states initially within the GaAs bandgap in such a way that recombination was reduced and efficiency increased.

The article described only devices having chemically treated GaAs electrodes contacting aqueous selenide/polyselenide solutions. There appears to be no way to accurately predict whether such chemical treatment of a gallium arsenide surface would reduce recombination and enhance device efficiency if the chemically treated semiconductor surface contacted any other material such as air, another gas or a metal.

SUMMARY OF THE INVENTION

We have found that semiconductor devices using chemically treated n-type GaAs have reduced surface recombination velocities. The n-type GaAs is chemically treated with ions of material selected from the group consisting of ruthenium, lead, rhodium, iridium and nickel. These ions may be complexed to form anions, cations or neutral species. The material is present on the surface in an amount greater than a hundredth of a monolayer and less than one monolayer. In an exemplary embodiment, the material is ruthenium and is desirably present in amounts between 0.001 $\mu$gm/cm$^2$ and 0.1 $\mu$gm/cm$^2$. The surface recombination velocity at the ruthenium GaAs-air interface is $3.5 \times 10^4$ cm/sec.

A Schottky junction solar cell using Ru treated n-type polycrystalline GaAs had an efficiency of approximately 4.8 percent at air mass 1 without application of an antireflection coating.

DETAILED DESCRIPTION

Figure 1:
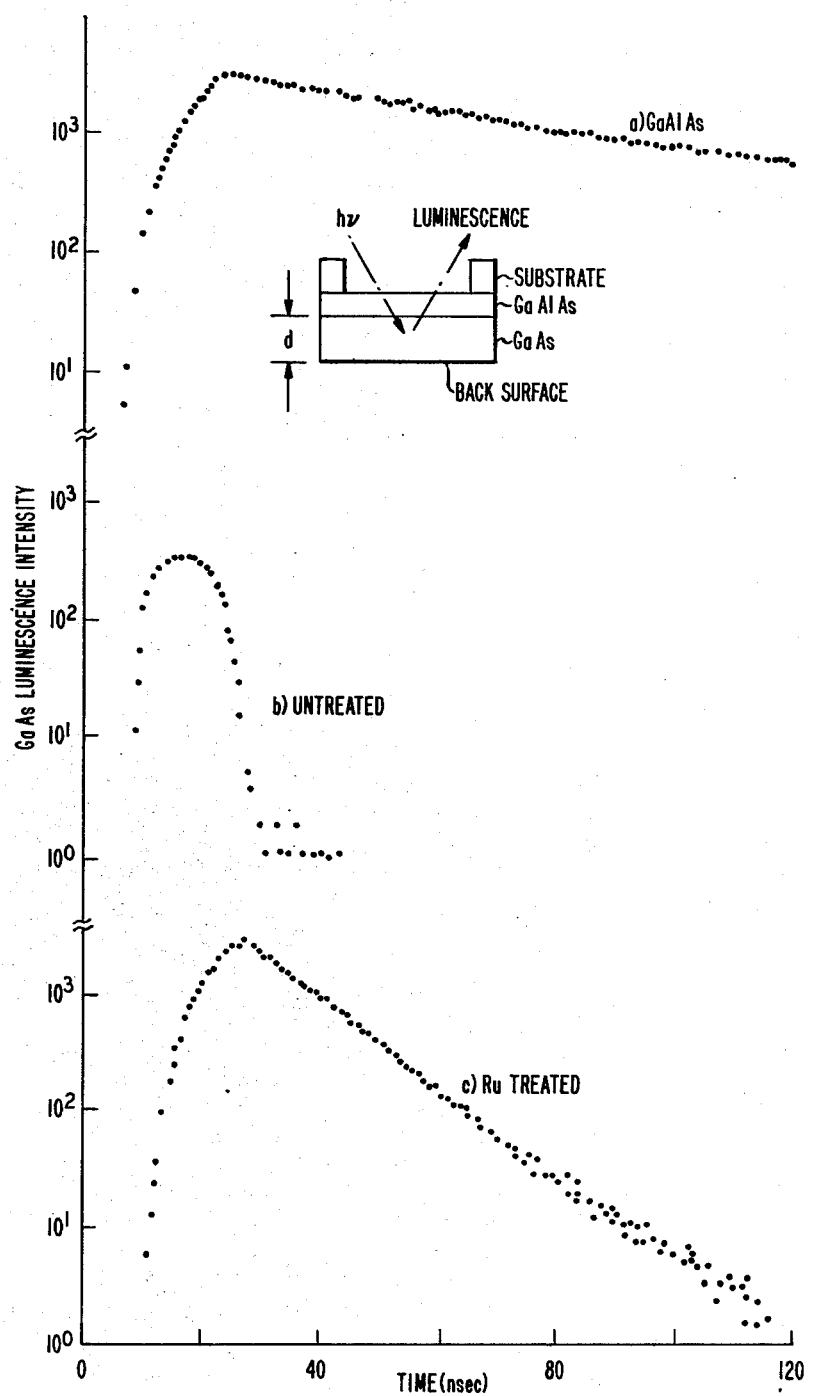
FIG. 1 plots time in nanoseconds, horizontally, versus the GaAs luminescence intensity, vertically, for (a) GaAs covered with GaAlAs, (b) untreated GaAs and (c) ruthenium-coated GaAs.

Methods for preparing and chemically treating, with selected materials, the surface of the n-type GaAs in a semiconductor device will be described first, and then recombination velocity measurements with a luminescent device and an exemplary Schottky junction solar cell device will be described in detail. Semiconductor device means solid state devices including those operating at air interfaces. The material is selected from the group consisting of ruthenium, rhodium, iridium, nickel and lead. It is to be understood that the invention is so described for purposes of illustration only and that the method of growing the GaAs, dopant and dopant concentration and crystallographic orientation of the substrate are not critical to this invention. It is also to be understood that the term surfaces is intended to include grain boundaries.

The reduced recombination velocity immproves the efficiency of minority carrier semiconductor devices including solar cells, Schottky barrier devices and luminescent devices, such as light emitting diodes and lasers. In many of these devices, there will be additional materials present in addition to the recombination velocity reducing material. The Schottky barrier devices have a layer of a noble metal disposed over the treated GaAs surface. The contemplated devices may further comprise an oxide layer, typically 50 Angstroms or less in thickness between the noble metal and GaAs surface.

The GaAs surface layer may contain arsenious oxide, elemental As and $Ga_2O_3$. The presence of the As or its oxide impedes the reduction of the surface recombination velocity by chemical treatment of the surface. Accordingly, several surface preparation steps are performed prior to the material deposition step.

The GaAs surface is first etched in a 1:1 $H_2SO_4$—30 percent $H_2O_2$ solution for several seconds at room temperature and rinsed with deionized water. Alternatively, a methanol/1 percent-5 percent bromine solution may be used for a time period between 30 seconds and 120 seconds.

Several alternatives are now available to remove the $Ga_2O_3$ and the As containing species, which are typically present at the surface. The etched GaAs surface may be immersed in a 1 M $K_2Se$+1 M KOH solution and rinsed in deionized water. Some possible reactions are 6 KOH+$Ga_2O_3$ 2 $K_3GaO_3$+3 $H_2O$ and 3 $Se_2$=+2 As 2 $AsSe_3^{-3}$ and 2 $nSe$=+$As_2O_3$+3 $H_2O$ 2 $AsSe_n^{3-2n}$+60 $H^-$. The $AsSe_3^{-3}$ complex is water soluble. The concentration of the KOH solution may vary between 0.01 M and 3.0 M. Other basic aqueous solutions may be used, but the selenide concentration is desirably between 0.1 M and 2.0 M. Another solution that may be used is $CH_3OH/Br$ and KOH. The possible reactions include $As_2O_3$+8 HBr 2 $AsBr_4^-$+2 $H^+$+3 $H_2O$ and 2 As+3 $Br_2$ 2 $AsBr_3$. $AsBr_3$ rapidly reacts with methanol to form water soluble products.

The GaAs surface is then immersed in a solution containing material selected from the group consisting of ruthenium, rhodium, iridium, nickel and lead. The solution may consist of metal ions as simple salts in a dilute acid such as 0.1 M HCl. The immersion step is approximately 1 to 3 minutes long at temperatures between 20 degrees C. and 70 degrees C., and is followed by a rinse in deionized water. This step may be preceded or followed by dipping in a lead acetate solution. The longer times and higher temperatures are especially desirable for polycrystalline electrodes as they permit diffusion along the grain boundaries. The treatment also reduces recombination at grain boundaries in polycrystalline GaAs. The salt concentration may vary between $10^{-6}$ M and $10^{-1}$ M, and other acids such as sulphuric, perchloric or nitric can be used instead of hydrochloric acid. If the salt concentration is less than $10^{-6}$ M, immersion times might become excessive, and the immersion time will not be reduced if concentrations exceed $10^{-1}$ M. The acid concentration may vary from 0.01 M and 1.0 M. Above 1.0 M, the semiconductor surface may etch, and below 0.01 M, the metal ions may hydrolyze excessively. Immersion times vary with concentration in the usual and well known manner. When the material is ruthenium, the solution may be conveniently prepared by using a 0.01 solution of $RuCl_3$ in 0.1 M HCl. Other salts such as nitrate or nitrosyl chloride may be used. Solutions of the other materials are prepared in analogous manner.

The recombination velocity reducing material should be present in an amount greater than approximately one-hundredth of a monolayer and less than one monolayer. As it is not known with certainty that the material is laid down with uniform thickness, it is perhaps more convenient to specify the amount of material on the surface in grams per unit area. When the material is ruthenium, it is desirably present in amounts between 0.001 $\mu gm/cm^2$ and 0.1 $\mu\ gm/cm^2$. A lesser amount of ruthenium might reduce the surface recombination velocity, but the reduction is not maximized.

Other methods, such as electroplating, can be used to chemically treat the surface with ruthenium. The dipping procedure described has been found to allow easy control of the amount of ruthenium deposited.

The chemical form of the ruthenium on the GaAs surface is not known with precision. It is known, however, as is discussed below, that the ruthenium is on the GaAs surface and neither migrates into the GaAs bulk nor substitutes for either Ga or As in the GaAs crystal lattice.

The surface recombination velocity may be determined, provided other material parameters, such as minority carrier diffusion constant and layer thickness, are known, by measurement of the luminescence decay time of the fundamental decay mode. FIG. 1 plots the luminescence decay of a 6-micron thick GaAs layer. The GaAs was grown on a (100) GaAs substrate and doped with Te to a concentration of $2 \times 10^{17}$ cm$^{-3}$.

The insert in FIG. 1 schematically represents the device and the experimental arrangement. A laser emitting at 7900 Angstroms was the photoexcitation source. Light of this wavelength, represented by $h\nu$, penetrates the GaAlAs layer and is absorbed in the GaAs layer. The time decay of the GaAs luminescence was measured with a photon counting system having a 0.3 nsec response time. The back surface is the ruthenium treated surface, and d is the layer thickness.

Curve (a) represents GaAs covered with a GaAlAs layer. Curves (b) and (c) represent GaAs, untreated, i.e., with a GaAs-air interface, and treated with ruthenium, respectively. As can be seen, the luminescence intensity decays much more slowly for the ruthenium treated GaAs that it does for the untreated GaAs. The slower decay indicates that the recombination velocity is lower at the ruthenium treated surface. The value of the recombination velocity is much reduced from that at the GaAs-air interface, although the recombination velocity for the ruthenium treated surface is still larger than the recombination velocity at the GaAlAs-GaAs interface.

Figure 2:
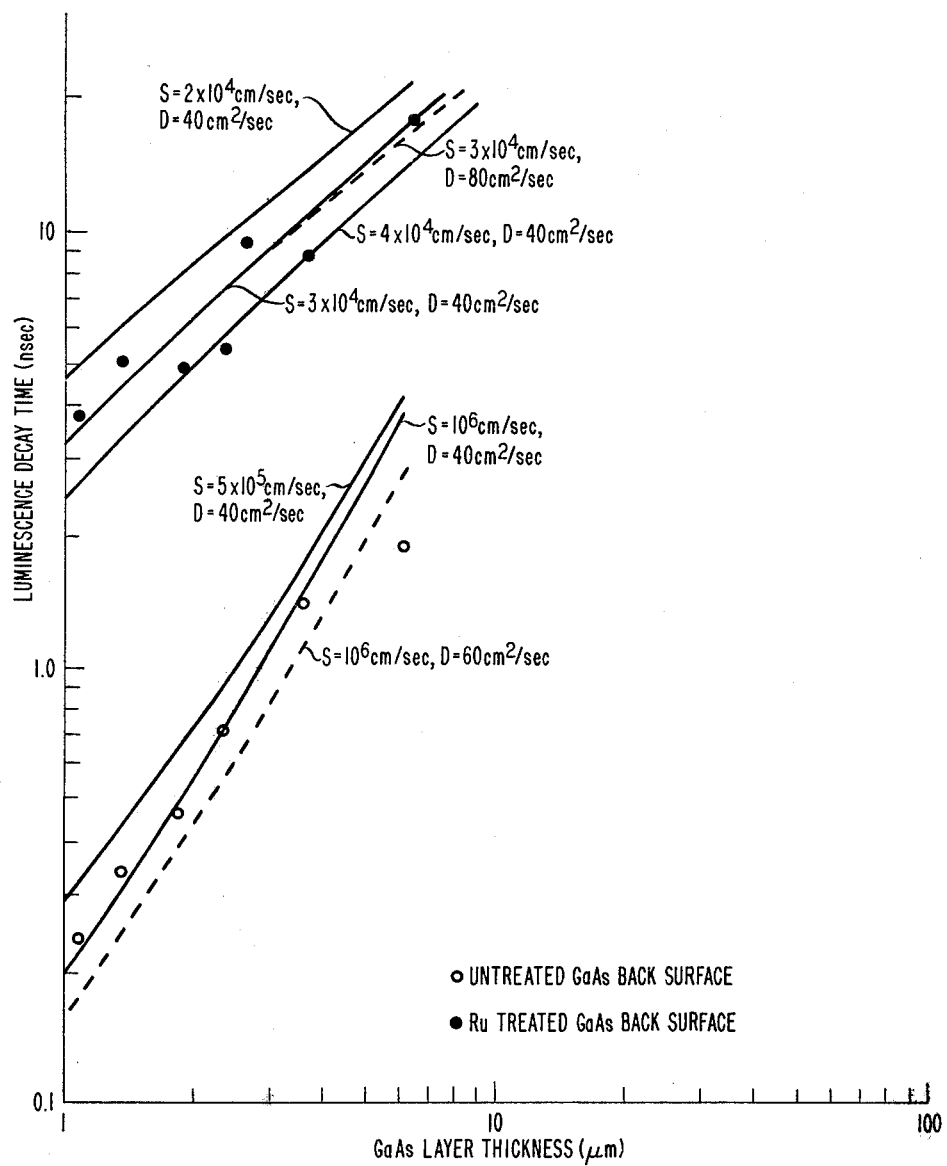
FIG. 2 plots GaAs layer thickness in microns, horizontally, versus the luminescence decay time in nanoseconds, vertically, for GaAs electrodes, both untreated and treated with solutions containing ruthenium ions.

Numerical values for the recombination velocity at the ruthenium treated surface may be obtained by measuring the luminescence decay for several GaAs layer thicknesses. Such plots are shown in FIG. 2 for GaAs grown as for FIG. 1, and having thicknesses between 1 micron and 10 microns. S represents the recombination velocity, and D the minority carrier diffusion coefficient as determined by a photoluminescence scanning technique. As can be seen from the figure, the ruthenium treated GaAs surfaces yield recombination velocities more than one order of magnitude smaller than those of the untreated surfaces.

Rutherford backscattering with 1.9 Mev $He^+$ ions was used to probe the ruthenium distribution and showed that the Ru was spatially localized, within 35

Angstroms at nonsubstitutional sites on the GaAs surface. The spatial localization of the ruthenium is very stable with respect to time. This stability is evidenced by the constant luminescent efficiency under intense laser illumination for extended time periods and the absence of ruthenium diffusion into the bulk upon exposure to temperatures at 300 degrees C for periods of 15 hours.

Example: A Schottky junction solar cell was prepared by depositing 30 microns of n-type GaAs by chemical vapor deposition on a carbon substrate coated with 500 Angstroms of tungsten. The Te dopant concentration was $2 \times 10^{17}$ cm$^{-3}$. The grain size of the crystallites was approximately 9 microns. The GaAs was etched in a solution consisting of one part 30 percent hydrogen peroxide, one part sulphuric acid and five parts water for 30 seconds. The material was then immersed in a 1 M $K_2Se$ and 1 M KOH solution as described previously and then in a 0.01 M $RuCl_3$ and 0.1 M HCl solution as described previously. A 100—Angstrom gold layer was deposited on the surface, and contact was made to the gold with aluminum fingers. The resulting solar cell, lacking an anti-reflection coating, had an efficiency at air mass 1 of approximately 4.8 percent.

The ruthenium is thus effective in reducing the recombination velocity for both polycrystalline, as well as single crystal GaAs, and the particular material forming the interface with the GaAs has not been found to be critical.

We claim:

1. A semiconductor device containing n-type GaAs, said n-type GaAs having a surface, a layer of material disposed on said surface, characterized in that said surface further contains material selected from the group consisting of ruthenium, rhodium, nickel, iridium and lead, said material being present in an amount equivalent to greater than one-hundredth of a monolayer and less than one monolayer.

2. A device as recited in claim 1 in which said material is present in an amount less than one monolayer.

3. A device as recited in claim 2 in which said material is ruthenium and said amount is greater than 0.001 $\mu$gm/cm$^2$ and less than 0.1 $\mu$gm/cm$^2$.

4. A device as recited in claim 1 or 3 further characterized in that said layer comprises a noble metal.

5. A device as recited in claim 4 in which said noble metal is selected from the group consisting of gold, silver and platinum.

6. A device as recited in claim 4 in which said layer comprises an oxide layer, said oxide layer being disposed between said GaAs surface and said noble metal layer.

* * * * *